United States Patent
Ching et al.

(10) Patent No.: US 9,978,870 B2
(45) Date of Patent: May 22, 2018

(54) FINFET WITH BURIED INSULATOR LAYER AND METHOD FOR FORMING

(71) Applicant: Taiwan Semiconductor Manufacturing Company, Ltd., Hsin-Chu (TW)

(72) Inventors: Kuo-Cheng Ching, Zhubei (TW); Chao-Hsiung Wang, Hsin-Chu (TW); Chi-Wen Liu, Hsinchu (TW); Guan-Lin Chen, Baoshan Township (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 71 days.

(21) Appl. No.: 14/949,664

(22) Filed: Nov. 23, 2015

(65) Prior Publication Data
US 2016/0087103 A1    Mar. 24, 2016

Related U.S. Application Data

(62) Division of application No. 14/055,417, filed on Oct. 16, 2013, now Pat. No. 9,196,522.

(51) Int. Cl.
*H01L 21/70* (2006.01)
*H01L 29/772* (2006.01)
(Continued)

(52) U.S. Cl.
CPC .... *H01L 29/7849* (2013.01); *H01L 21/76205* (2013.01); *H01L 29/0653* (2013.01);
(Continued)

(58) Field of Classification Search
CPC ............ H01L 29/785; H01L 29/66795; H01L 29/045; H01L 29/7853; H01L 21/823821;
(Continued)

(56) References Cited

U.S. PATENT DOCUMENTS

| 8,237,226 | B2 * | 8/2012 | Okano | H01L 21/324 257/368 |
| 8,673,718 | B2 * | 3/2014 | Maszara | H01L 29/66795 438/268 |

(Continued)

FOREIGN PATENT DOCUMENTS

| CN | 101752258 | 6/2010 |
| KR | 20060121883 | 11/2006 |

(Continued)

OTHER PUBLICATIONS

P. Gas et al., "Diffusion of Sb, Ga, Ge, and (As) in TiSi2." Journal of Applied Physics 63 (11), Jun. 1, 1988, pp. 5335-5345, American Institute of Physics, Yorktown Heights, New York.

(Continued)

*Primary Examiner* — Marcos D Pizarro
*Assistant Examiner* — Nelson Garces
(74) *Attorney, Agent, or Firm* — Haynes and Boone, LLP

(57) ABSTRACT

A fin structure suitable for a FinFET and having a buried insulator layer is disclosed. In an exemplary embodiment, a semiconductor device comprises a substrate with a first semiconductor material and having a fin structure formed thereupon. The fin structure includes a lower region proximate to the substrate, a second semiconductor material disposed on the lower region, a third semiconductor material disposed on the second semiconductor material, and an insulating material selectively disposed on the second semiconductor material such that the insulating material electrically isolates a channel region of the fin structure and further such that the insulating material exerts a strain on the channel region. The semiconductor device further comprises an isolation feature disposed adjacent to the fin structure.

18 Claims, 19 Drawing Sheets

(51) Int. Cl.

| | | |
|---|---|---|
| *H01L 21/336* | (2006.01) | |
| *H01L 21/335* | (2006.01) | |
| *H01L 29/78* | (2006.01) | |
| *H01L 29/66* | (2006.01) | |
| *H01L 29/161* | (2006.01) | |
| *H01L 29/165* | (2006.01) | |
| *H01L 21/762* | (2006.01) | |
| *H01L 29/10* | (2006.01) | |
| *H01L 29/06* | (2006.01) | |
| *H01L 29/16* | (2006.01) | |

(52) U.S. Cl.
CPC .......... *H01L 29/1054* (2013.01); *H01L 29/16* (2013.01); *H01L 29/66545* (2013.01); *H01L 29/66795* (2013.01); *H01L 29/785* (2013.01); *H01L 29/7843* (2013.01)

(58) Field of Classification Search
CPC ............... H01L 21/845; H01L 27/0924; H01L 27/1211; H01L 21/823431; H01L 27/0886; H01L 29/7834; H01L 2029/7858; H01L 29/41791; H01L 21/02433; H01L 21/26586; H01L 29/7849; H01L 29/16; H01L 29/0653; H01L 29/1054; H01L 29/66545; H01L 21/76205; H01L 29/7843
USPC .................................................. 257/342–352
See application file for complete search history.

(56) References Cited

U.S. PATENT DOCUMENTS

| | | | |
|---|---|---|---|
| 8,815,694 B2 | 8/2014 | Cheng et al. | |
| 2009/0008705 A1 | 1/2009 | Zhu et al. | |
| 2012/0292672 A1 | 11/2012 | Cho | |
| 2014/0231872 A1 | 8/2014 | Colinge et al. | |
| 2014/0264592 A1 | 9/2014 | Oxland et al. | |
| 2014/0353731 A1* | 12/2014 | Colinge .............. | H01L 29/7843 257/288 |
| 2015/0028426 A1* | 1/2015 | Ching .................. | H01L 29/785 257/401 |

FOREIGN PATENT DOCUMENTS

| | | |
|---|---|---|
| KR | 20030026235 | 3/2013 |
| WO | WO 2013/095384 A1 | 6/2013 |

OTHER PUBLICATIONS

F. K. Legoues, et al., "Kinetics and Mechanism of Oxidation of SiGe: Dry Versus Wet Oxidation." Applied Physics Letters 54, 644, 2008, Feb. 13, 1989, pp. 644-646, American Institute of Physics.

C. Tetelin, et al., "Kinetics and Mechanism of Low Temperature Atomic Oxygen-Assisted Oxidation of SiGe Layers." Journal of Applied Physics, vol. 83, No. 5, Mar. 1, 1998, pp. 2842-2846, American Institute of Physics.

Masanori Tanaka et al., "Abnormal Oxidation Characteristics of SiGe/Si-on-insulator Structures Depending on Piled-Up Ge Fraction at Si02/SiGe Interface." Journal of Applied Physics 103, 2008, pp. 054909-1 through 054909-5, American Institute of Physics.

Chih-Hao Wang et al., "Semiconductor Device and Fabricating the Same." Utility under 35 USC 111(a), Jan. 14, 2013, pp. 1-21 text, pp. 1-17 drawings, U.S. Appl. No. 13/740,373, United States Patent and Trademark Office.

Chih-Hao Wang et al., "FinFET Device and Method of Fabricating Same." Utility under 35 USC 111(a), May 24, 2013, pp. 1-20 text, pp. 1-15 drawings, U.S. Appl. No. 13/902,322, United States Patent and Trademark Office.

Kuo-Cheng Ching et al., "Fin Structure of Semiconductor Device." Utility under 35 USC 111(a), Jul. 3, 2013, pp. 1-21 text, pp. 1-12 drawings, U.S. Appl. No. 13/934,992 , United States Patent and Trademark Office.

Kuo-Cheng Ching et al., "Isolation Structure of Fin Field Effect Transistor." Utility under 35 USC 111(a), Sep. 11, 2013, pp. 1-20 text, pp. 1-12 drawings, U.S. Appl. No. 14/024,148, United States Patent and Trademark Office.

Korean Patent and Trademark Office, Korean Patent Office Action dated Jan. 19, 2017, for Application No. 10 2016 0059398, 4 pages.

* cited by examiner

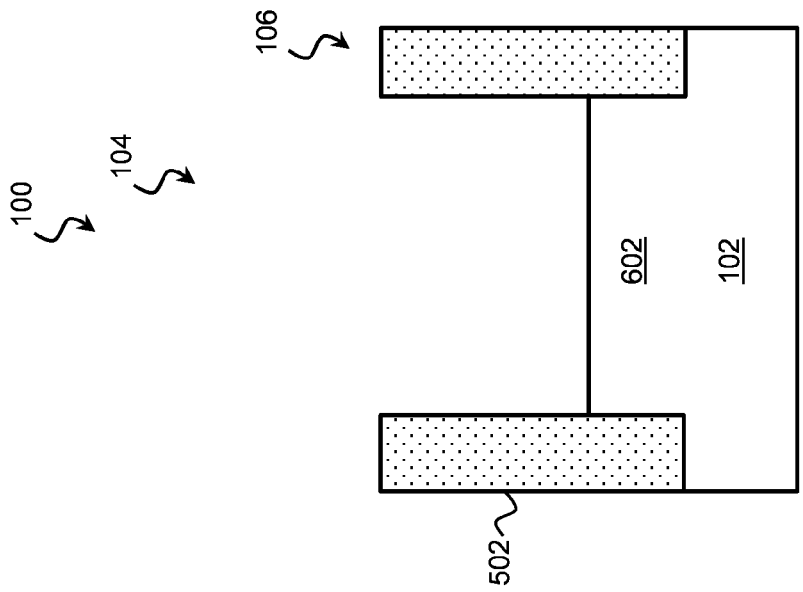
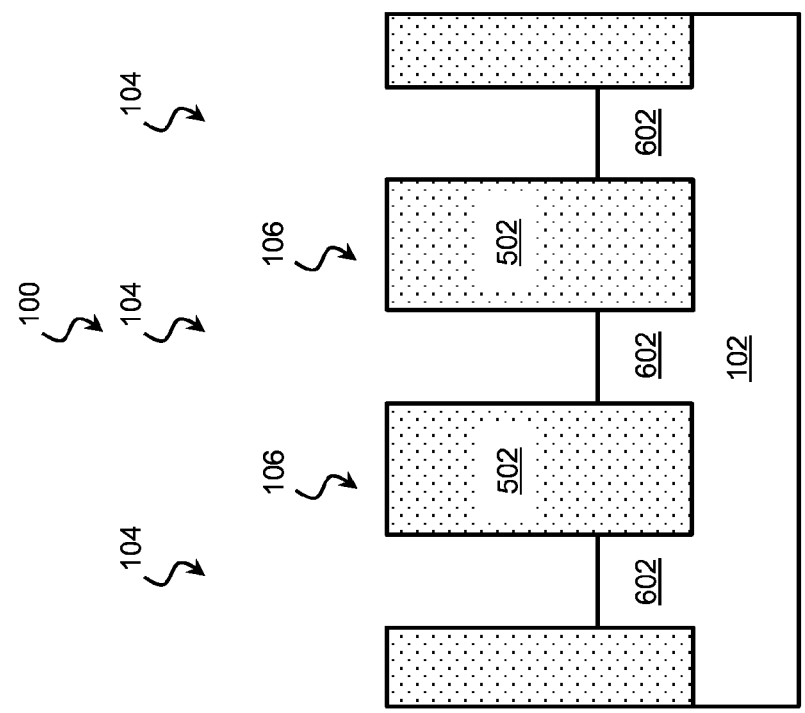

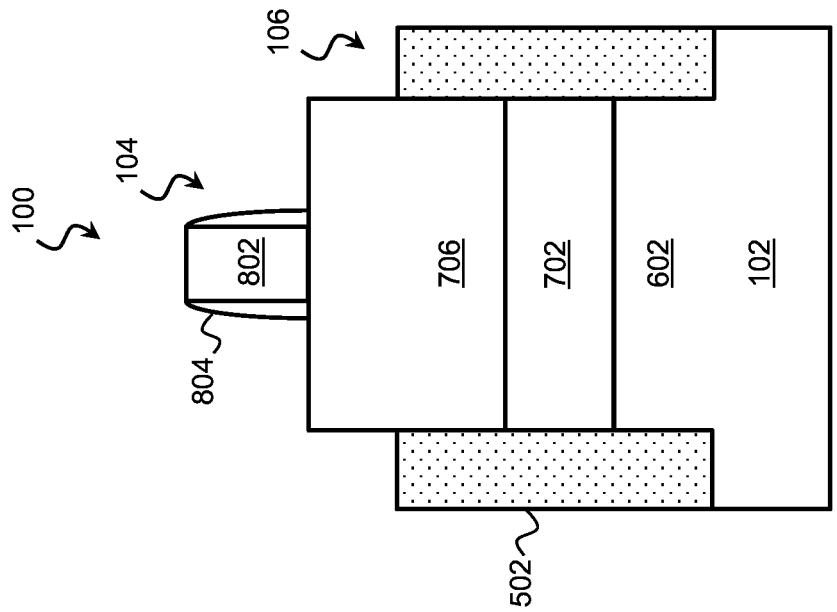
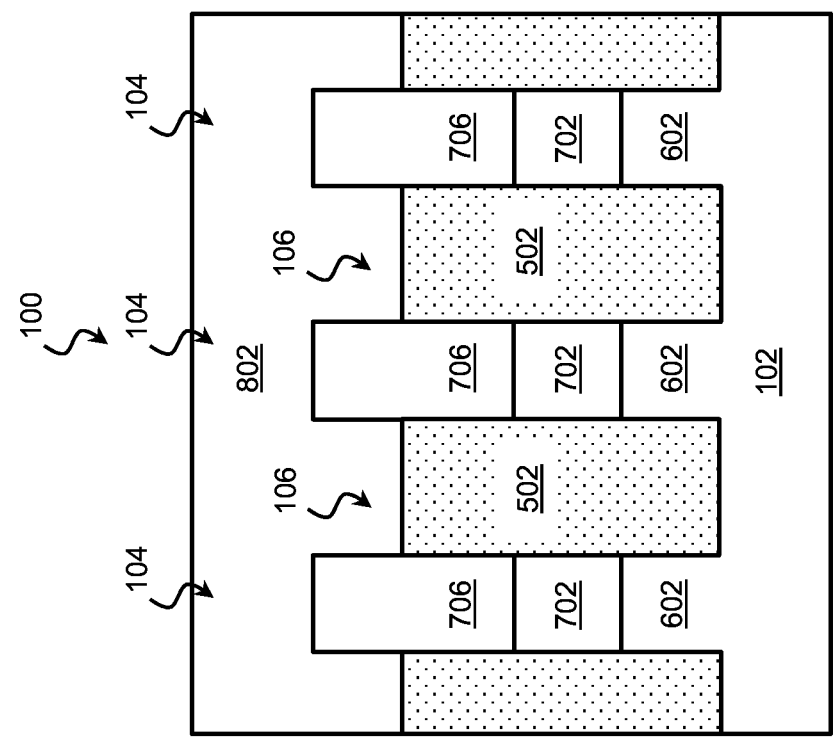
Figure 8A
Figure 8B

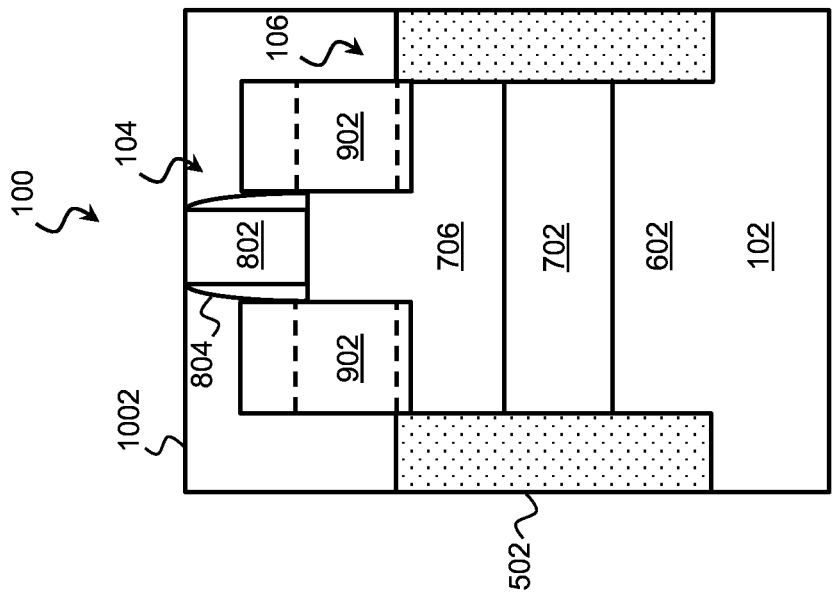
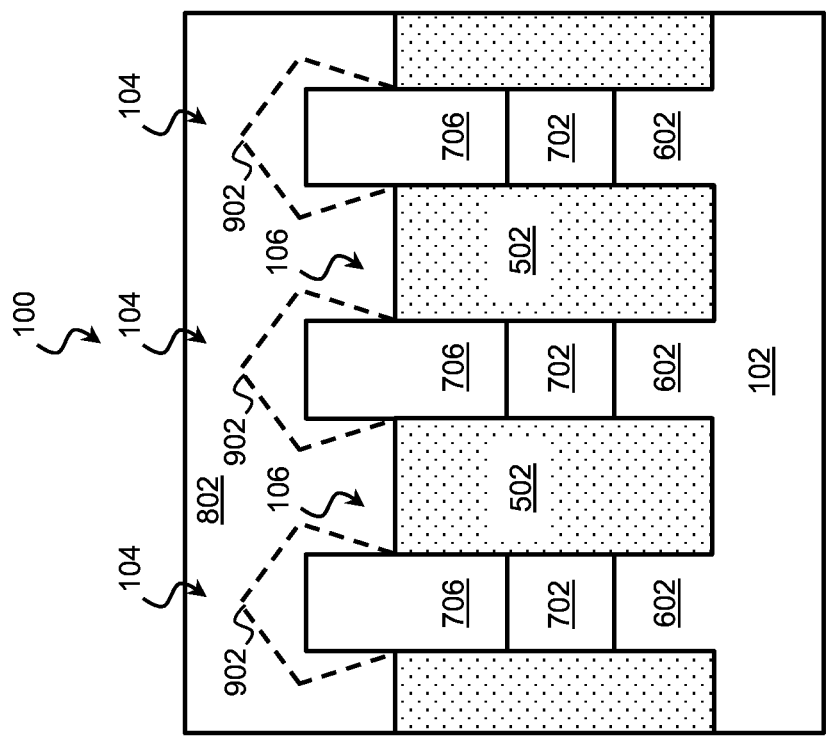
Figure 10A
Figure 10B

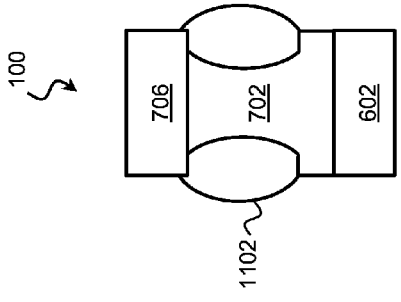
Figure 12C
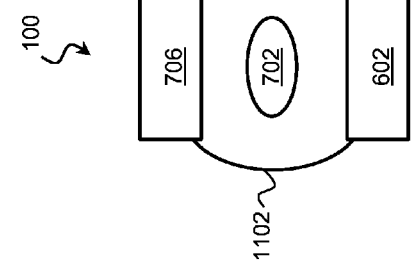
Figure 12D
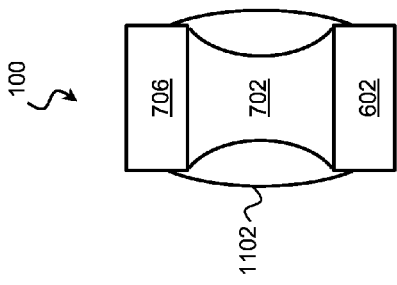
Figure 12A
Figure 12B

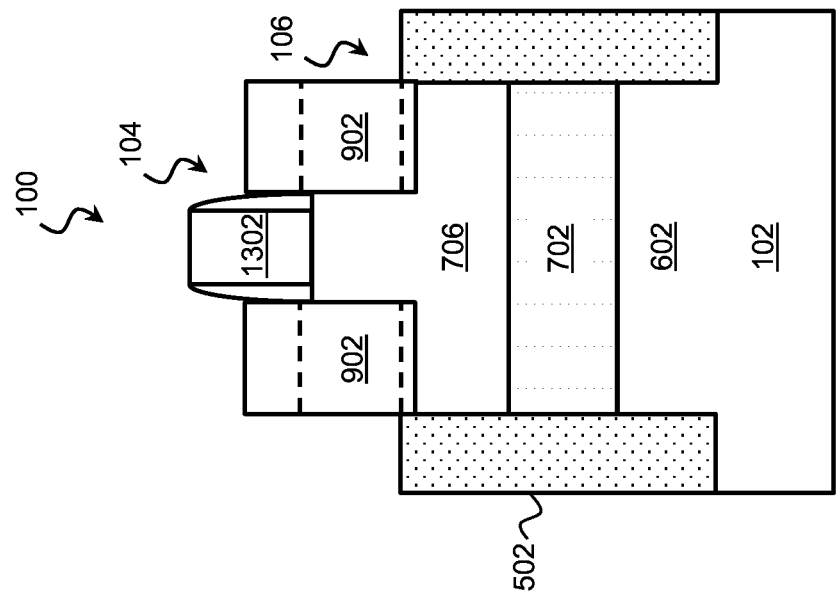
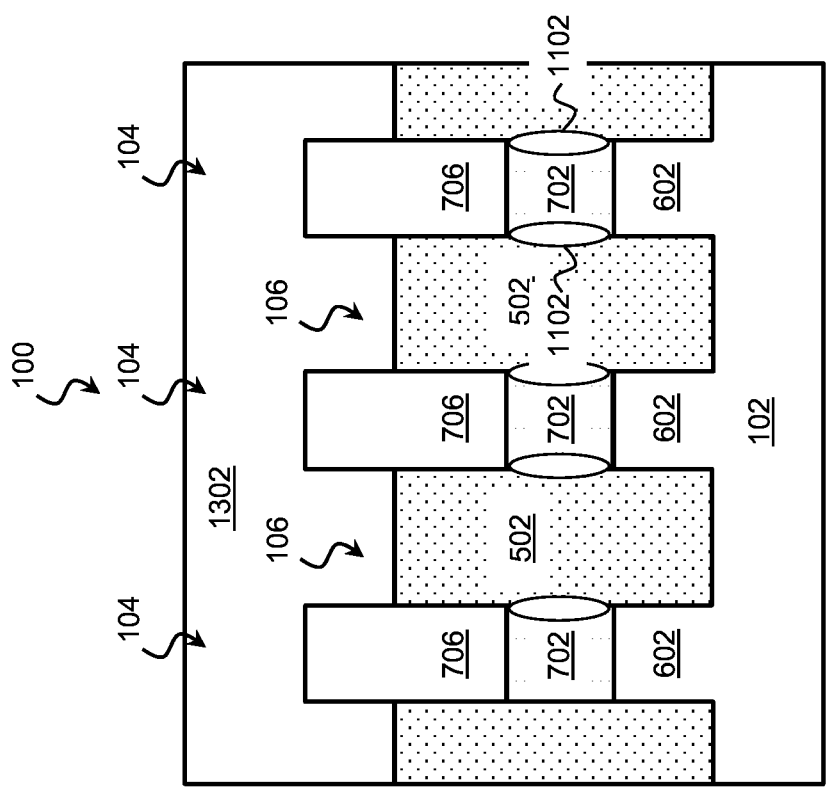
Figure 13B
Figure 13A

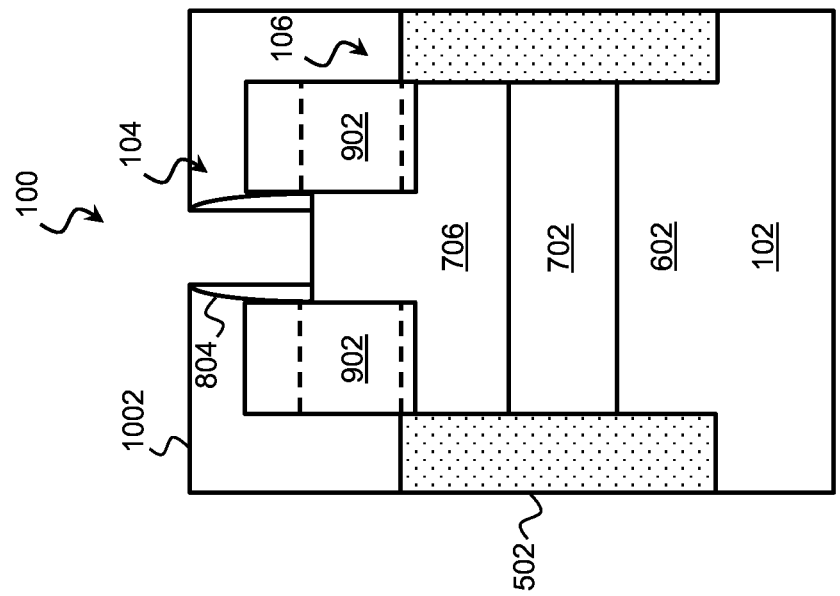
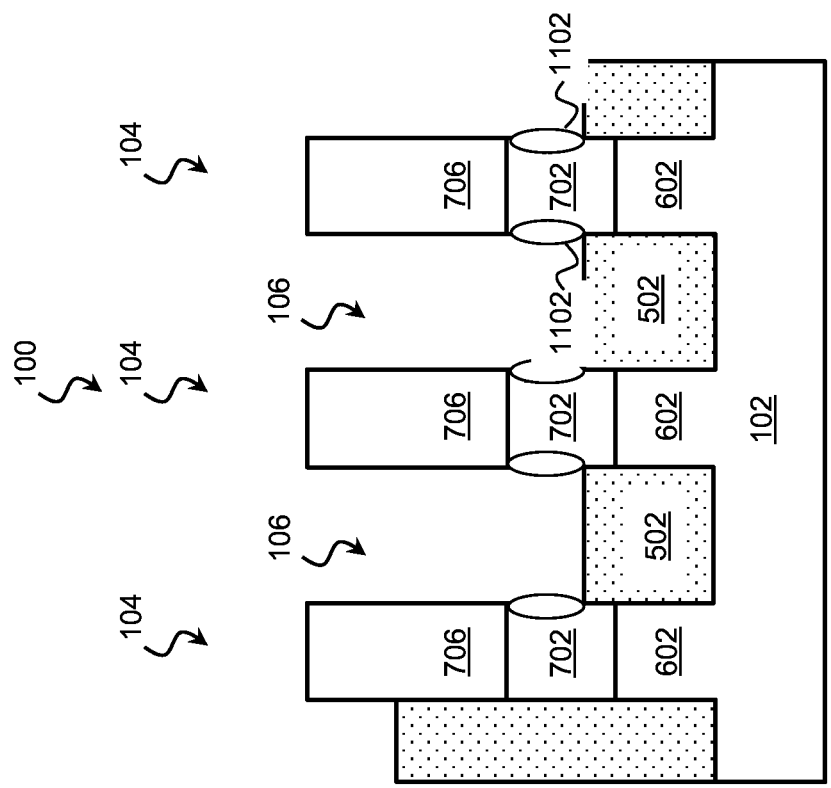
Figure 17B
Figure 17A

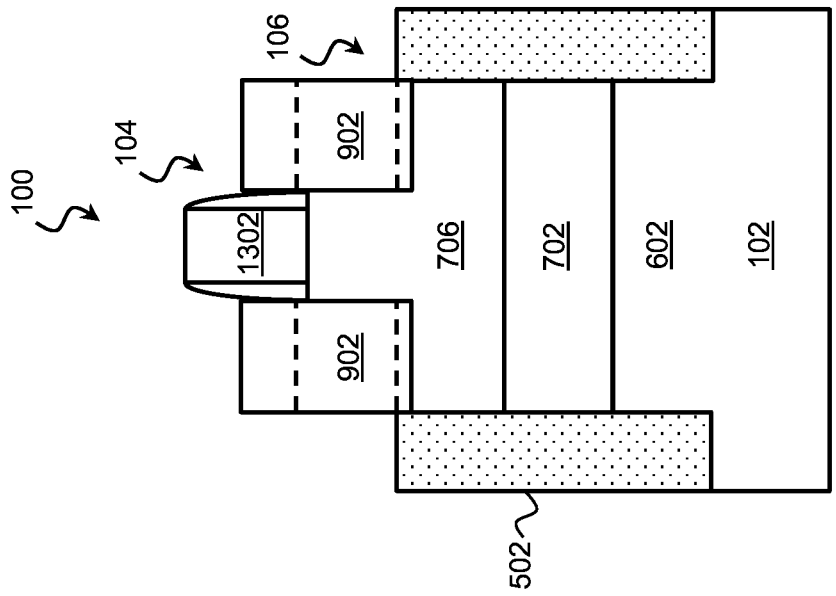
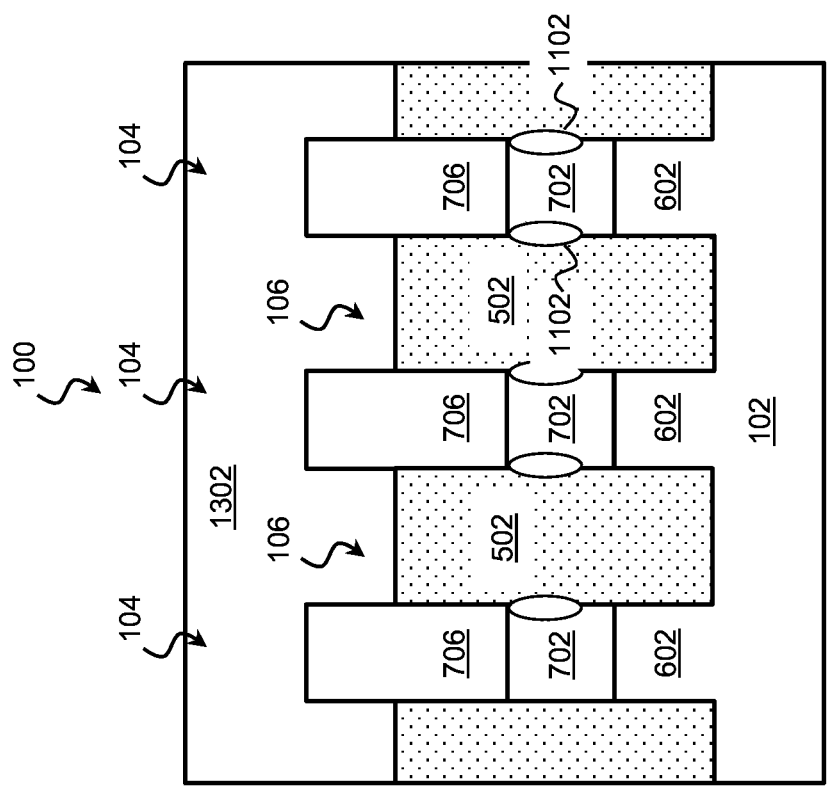

FINFET WITH BURIED INSULATOR LAYER AND METHOD FOR FORMING

CROSS-REFERENCE TO RELATED APPLICATIONS

This application is a divisional application of U.S. Ser. No. 14/055,417, filed Oct. 16, 2013 by inventors Kuo-Cheng Ching, et al., entitled "FinFET with Buried Insulator Layer and Method for Forming", the disclosure of which is herein incorporated by reference in its entirety.

BACKGROUND

As the semiconductor industry has progressed into nanometer technology process nodes in pursuit of higher device density, higher performance, and lower costs, challenges from both fabrication and design issues have motivated circuit designers to look to novel structures to deliver improved performance. One avenue of inquiry is the development of three-dimensional designs, such as a fin-like field effect transistor (FinFET). A FinFET can be thought of as a typical planar device extruded out of a substrate and into the gate. A typical FinFET is fabricated on a thin "fin" (or fin structure) extending upwards from the body from the substrate, and may be formed by depositing fin material on the substrate, etching, non-fin areas of the substrate, or a combination thereof. The channel of the FET is formed in this vertical fin, and a gate is provided over (e.g., wrapping) the fin. Wrapping the gate around the fin increases the contact area between the channel region and the gate and allows the gate to control the channel from both sides. This may result in higher current flow, a reduction in short channel effect, and other advantages.

Because of the complexity inherent in FinFETs and other nonplanar devices, a number of techniques used in manufacturing planar transistors are not available in manufacturing nonplanar devices. As merely one example, buried insulator layers are used to isolate devices and to lower parasitic capacitance. However, many conventional techniques for forming a semiconductor substrate with a buried insulator layer are not well suited for use with FinFET devices. Therefore, while existing fabrication techniques have been generally adequate for planar devices, in order to continue to meet ever-increasing design requirements, further advances are needed.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3A-13B are cross-sectional views of a portion of a workpiece undergoing the method for forming a fin structure with a buried insulator layer according to various aspects of the present disclosure.

FIGS. 15A-19B are cross-sectional views of a portion of a workpiece undergoing the method for forming a fin structure with a buried insulator layer according to various aspects of the present disclosure.

DETAILED DESCRIPTION

Figure 1:
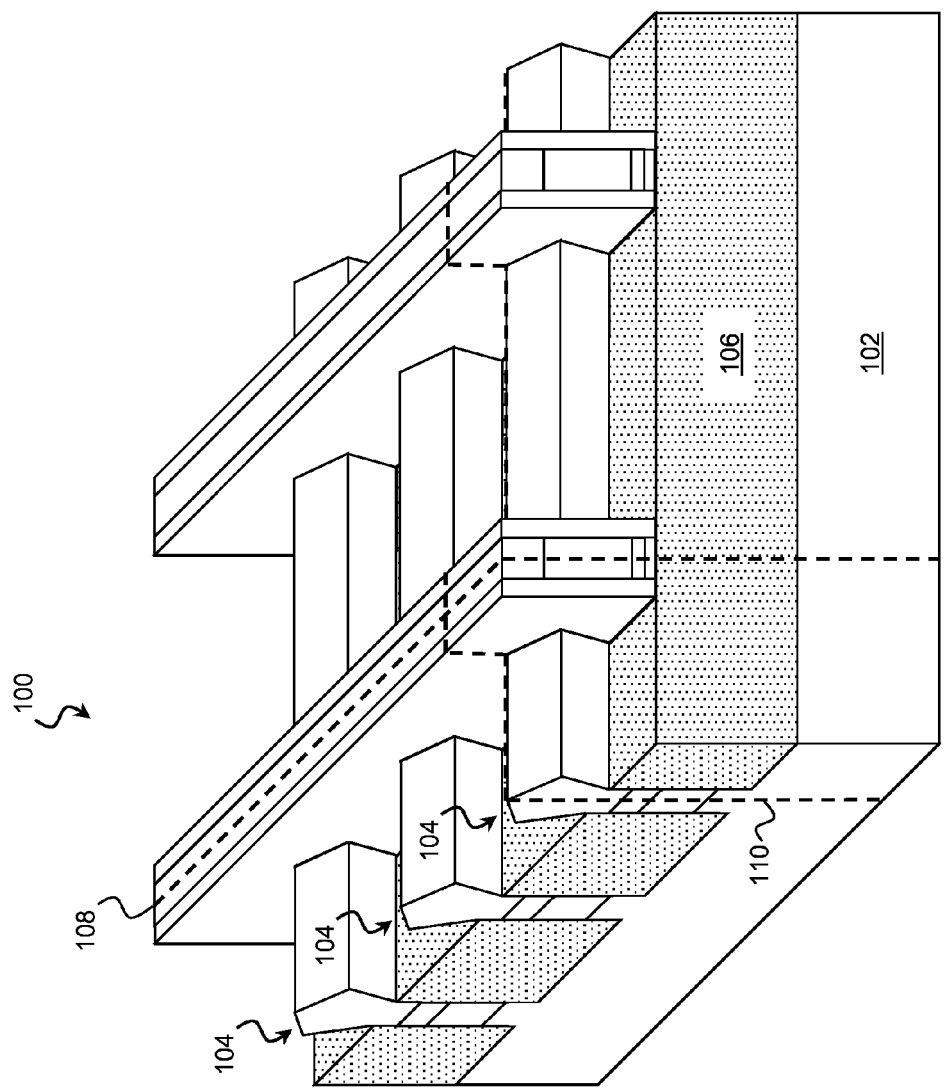
FIG. 1 is a perspective view of a portion of a workpiece according to various aspects of the present disclosure.

The present disclosure relates generally to IC device manufacturing and, more particularly, to a FinFET with a buried insulating layer and a method for forming the same.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

FIG. 1 is a perspective view of a portion of a workpiece 100 according to various aspects of the present disclosure. FIG. 1 has been simplified for the sake of clarity and to better illustrate the concepts of the present disclosure. Additional features may be incorporated into the workpiece 100, and some of the features described below may be replaced or eliminated for other embodiments of the workpiece 100.

The workpiece 100 includes a substrate 102 or wafer with one or more fin structures 104 formed upon it. The fin structures 104 are representative of any raised feature, and while the illustrated embodiments include FinFET fin structures 104, further embodiments include other raised active and passive devices formed upon the substrate 102. As described in more detail below, the fin structures 104 are formed by any suitable process including various deposition, photolithography, and/or etching processes. It is understood that multiple parallel fin structures 104 may be formed in a similar manner. The fin structures 104 are separated and electrically isolated by isolation features 106. However, as can be seen, a current path still exists through the vertical axis of the fin structures 104 into the body of the substrate 102. In various embodiments, the methods and structures of the present disclosure include a semiconductor oxide (e.g., a silicon oxide and/or a germanium oxide) that insulates a channel region of a fin structure 104 from the body of the substrate 102.

For clarity, FIG. 1 illustrates two cross-sectional planes (plane 108 and plane 110) of the workpiece 100. Various exemplary methods of forming the fin structures 104 and the workpiece 100 are described with reference to the following figures, which include cross-sections taken along planes 108 and 110.

Figure 2:
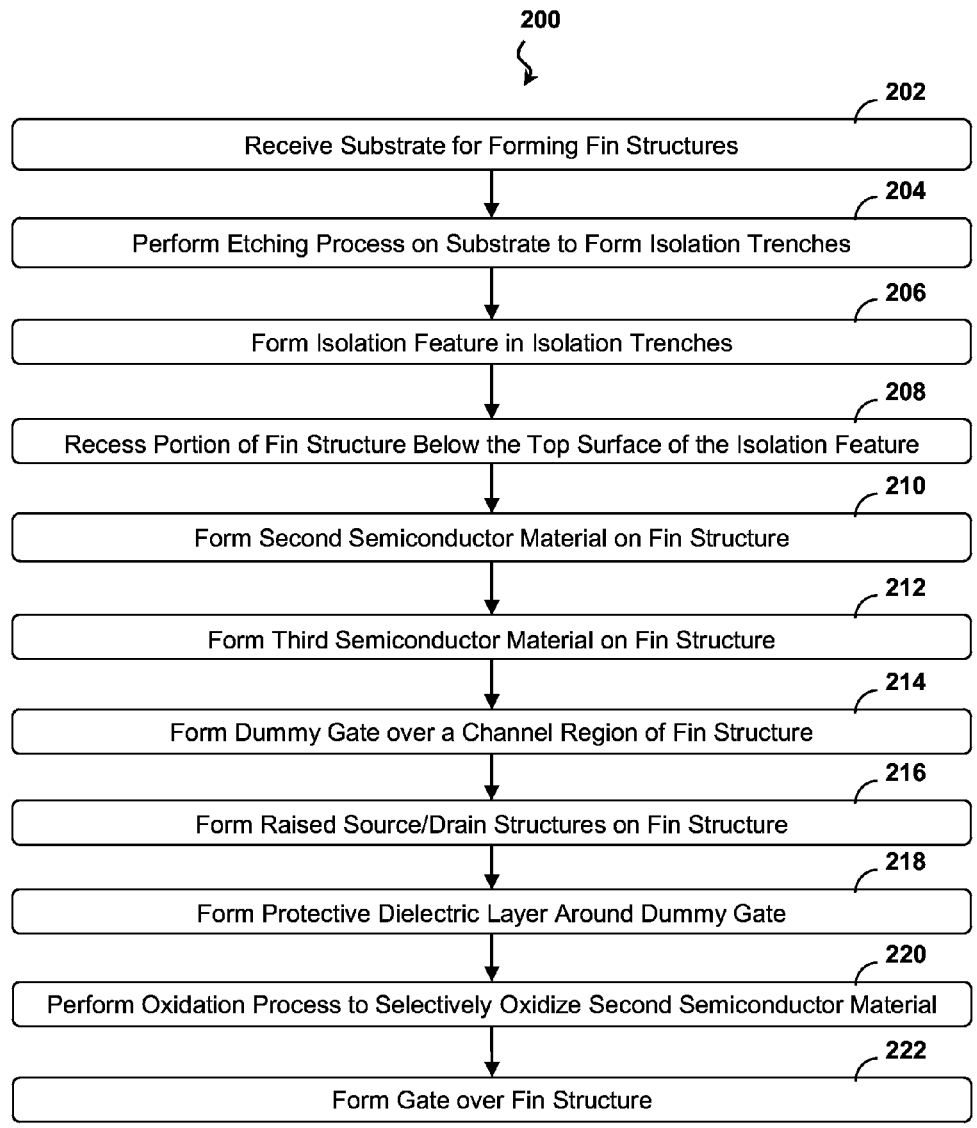
FIG. 2 is a flow diagram of a method for forming a workpiece having a fin structure with a buried insulator layer according to various aspects of the present disclosure.

FIG. 2 is a flow diagram of a method 200 for forming a workpiece 100 having a fin structure 104 with a buried insulator layer according to various aspects of the present disclosure. It is understood that additional steps can be provided before, during, and after the method 200 and that some of the steps described can be replaced or eliminated for other embodiments of the method. FIGS. 3A-13B are cross-sectional views of a portion of the workpiece 100 undergoing the method 200 for forming a fin structure 104 with a buried insulator layer according to various aspects of the present disclosure. FIGS. 3A, 4A, 5A, 6A, 7A, 8A, 9A, 10A, 11A, 12A-D, and 13A are cross-sections taken along a first cross-sectional plane 108. FIGS. 3B, 4B, 5B, 6B, 7B, 8B, 9B, 10B, 11B, and 13B are cross-sectionals taken along a second cross-sectional plane 110. FIGS. 3A-13B have been simplified for the sake of clarity and to better illustrate the concepts of the present disclosure.

Figure 3B:
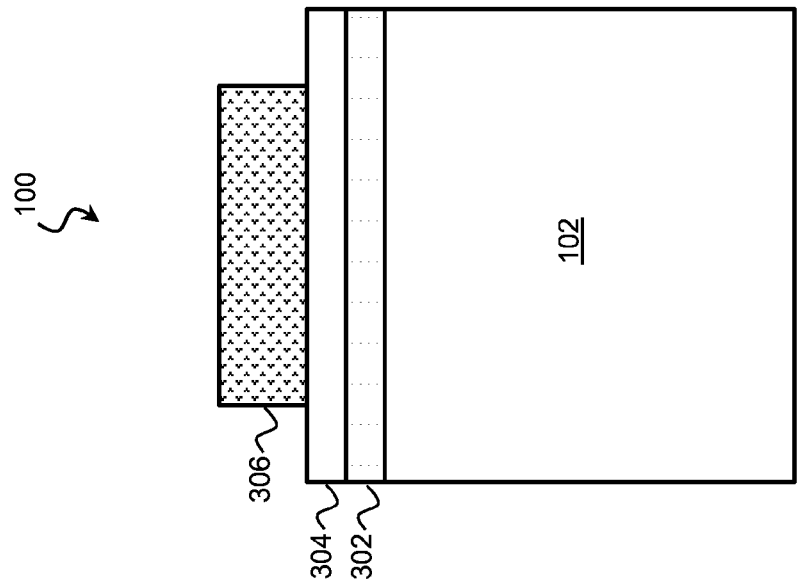
Figure 3A:
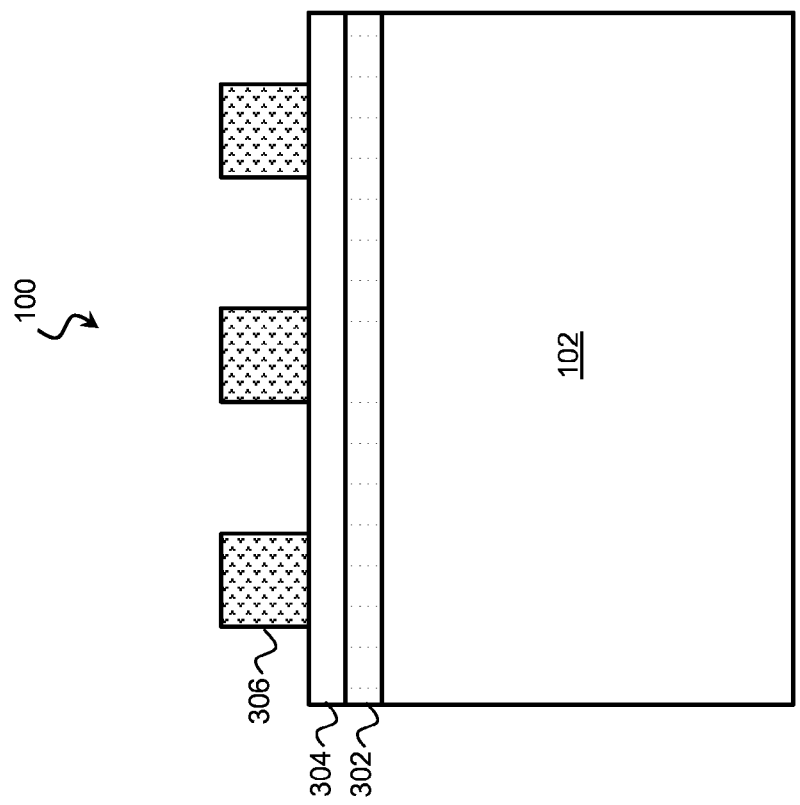

Referring first to block 202 of FIG. 2 and to FIGS. 3A and 3B, a substrate 102 is received. As will be described in detail below, fin structures 104 are formed on the substrate 102. In so doing, a semiconductor oxide may be formed within the fin structures 104 to electrically isolate the fin structures 104 from the substrate and from each other. This reduces device leakage of devices formed on the fin structures 104. Additionally, it has also been found that certain configurations of semiconductor oxide cause a strain on the channel region of the fin structures 104. When formed under the proper conditions, this semiconductor oxide can be used to improve carrier mobility throughout the associated device. By tuning the formation of the semiconductor oxide, device performance can be improved, and in some embodiments, multiple profiles of the semiconductor oxide can be produced on a single substrate 102, each selected to improve the respective devices.

In general, channel strain enhances electrical performance at the expense of increased device leakage. Selective strain may be applied to devices based on an intrinsic property of the device. For example, IC devices with smaller critical dimensions may require greater carrier mobility in order to meet performance requirements and may be formed with a strained channel region in order to provide greater carrier mobility. Selective strain may also be applied to devices based on the application. For example, IC devices critical to overall performance may be designated for higher strain than devices that are not performance critical. Devices may also be selected for a strained channel based on device type. For conventional planar devices, compressive strain on the channel region typically improves the carrier mobility of pMOS devices, while tensile strain improves the carrier mobility of nMOS devices. The semiconductor oxide formed by the present method 200 could be expected to exert a compressive strain because forming the oxide causes expansion within a confined space. Unexpectedly however, this strain is more characteristic of a tensile strain and actually improves carrier mobility of nMOS devices more than pMOS devices. Accordingly, in many embodiments, the method 200 is selectively applied to fin structures 104 for nMOS devices. In many embodiments, devices strain is selected based on a combination of device properties, processing characteristics, and performance requirements. Other criteria for identifying a strain profile for fin structures 104 are both contemplated and provided for. In the illustrated embodiments, the fin structures 104 within the illustrated portion of the workpiece 100 are designated for forming a semiconductor oxide that produces an increased channel strain.

Referring still to FIGS. 3A and 3B, in some embodiments, the substrate 102 includes a bulk silicon substrate. Alternatively, the substrate 102 may comprise an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof. Possible substrates 102 also include a silicon-on-insulator (SOI) substrate. SOI substrates are fabricated using separation by implantation of oxygen (SIMOX), wafer bonding, and/or other suitable methods.

The substrate 102 may include various doped regions depending on design requirements as known in the art (e.g., p-type wells or n-type wells). The doped regions are doped with p-type dopants, such as boron or $BF_2$; n-type dopants, such as phosphorus or arsenic; or combinations thereof. The doped regions may be formed directly on the substrate 102, in a P-well structure, in an N-well structure, in a dual-well structure, or using a raised structure. The semiconductor substrate 102 may further include various active regions, such as regions configured for an N-type metal-oxide-semiconductor transistor device (nMOS) and regions configured for a P-type metal-oxide-semiconductor transistor device (pMOS).

The substrate 102 may include one or more layers formed on the substrate 102. In the illustrated embodiment, these layers include a pad layer 302, a mask layer 304, and a photoresist layer 306. The pad layer 302 acts as an adhesion layer between the substrate 102 and other material layers. Accordingly, the pad layer 302 may include a thin semiconductor oxide or semiconductor nitride. In some embodiments, the pad layer 302 is different in composition from adjacent material layers and/or the substrate 102 in order to act as an etch stop. The mask layer 304 acts as a hard mask during a lithographic process and may include a semiconductor nitride or semiconductor oxynitride. Similar to the pad layer 302, in some embodiments, the mask layer 304 is different in composition from the pad layer 302, the substrate 102, and/or other material layers in order to act as an etch stop.

An exemplary photoresist layer 306 includes a photosensitive material that enables the layer 306 to undergo a property change when exposed to light. This property change can be used to selectively remove exposed or unexposed portions of the photoresist layer 306 in a process referred to as lithographic patterning. An exemplary patterning process includes soft baking of the photoresist layer 306, mask aligning, exposure, post-exposure baking, developing the photoresist layer 306, rinsing, and drying (e.g., hard baking). Alternatively, a photolithographic process may be implemented, supplemented, or replaced by other methods such as maskless photolithography, electron-beam writing, and ion-beam writing. In the embodiment of FIGS. 3A and 3B, the photoresist layer 306 has been patterned in order to define a set of isolation trenches.

Figure 4B:
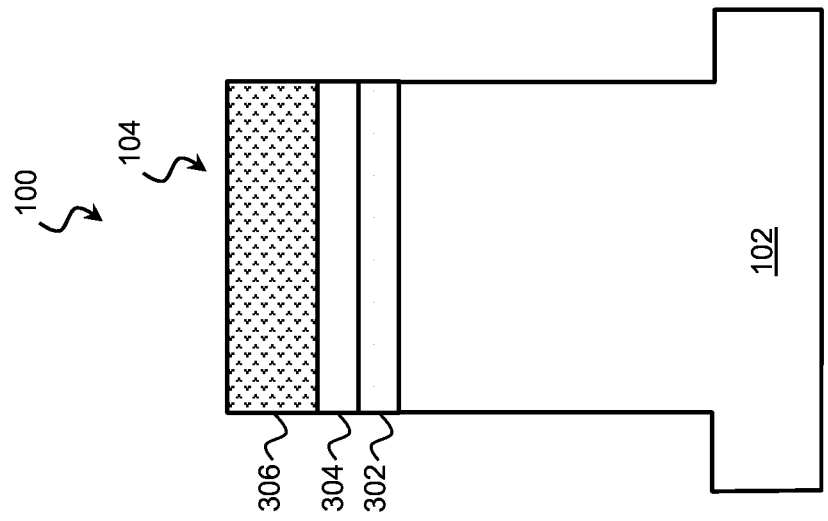
Figure 4A:
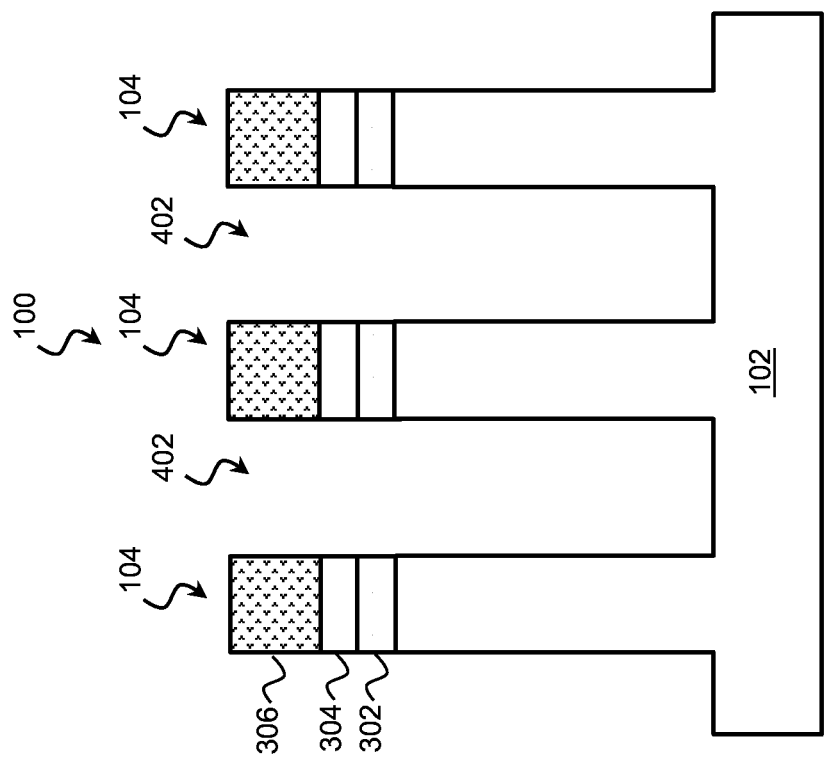

Referring to block 204 of FIG. 2 and to FIGS. 4A and 4B, an etching process is performed on the substrate 102 to form the isolation trenches 402. In some embodiments, this includes etching through (opening) portions of the mask layer 304 and/or the pad layer 302. The etching of block 204 may include any suitable etching process such as dry etching, wet etching, ashing, and/or other etching methods (e.g., reactive ion etching). In some embodiments, etching includes multiple etching steps with different etching chemistries each targeting a particular material. For example, in an embodiment, the substrate 102 is etched using a dry etching process using a fluorine-based etchant. The etching of block 204 is configured to produce trenches 402 of any suitable width and depth extending from the top surface of the substrate 102 into the substrate 102.

Figure 5B:
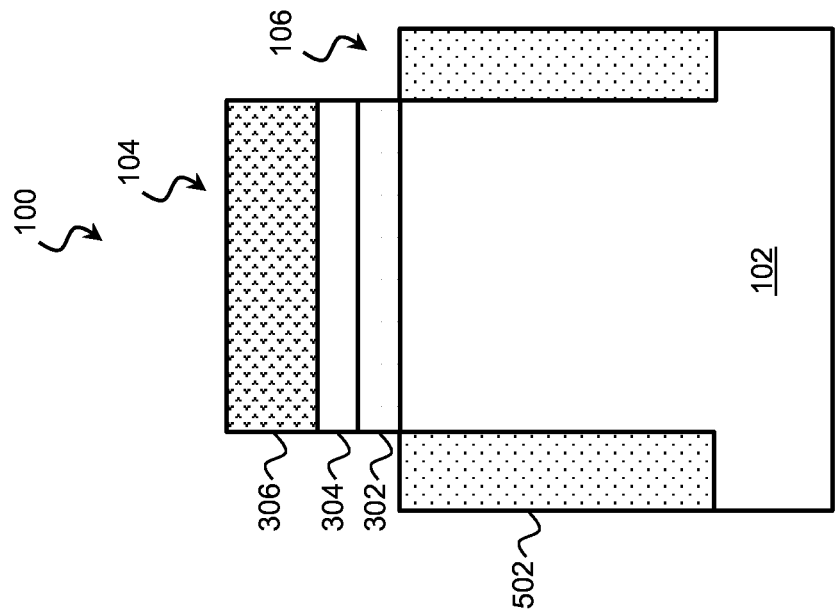
Figure 5A:
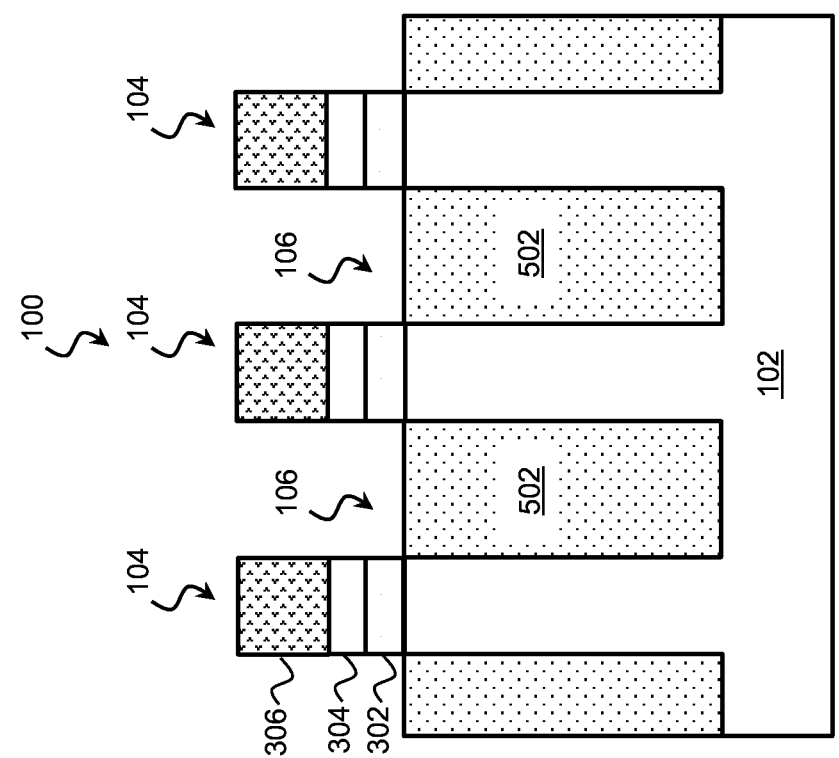

Referring to block 206 of FIG. 2 and to FIGS. 5A and 5B, an isolation feature 106 (e.g., a shallow trench isolation feature, deep trench isolation feature, or other suitable feature) may be formed in one or more of the trenches 402. In some embodiments, the formation of the isolation feature 106 includes depositing a liner (not shown) in the trench 402. The liner reduces crystalline defects at the interface between the substrate 102 and the isolation feature 106. The liner may include any suitable material including a semiconductor nitride, a semiconductor oxide, a thermal semiconductor oxide, a semiconductor oxynitride, a polymer dielectric, and/or other suitable materials, and may be formed using any suitable deposition process including thermal growth, atomic layer deposition (ALD), chemical vapor deposition (CVD), high-density plasma CVD (HDP-CVD), physical vapor deposition (PVD), and/or other suitable deposition processes. In some embodiments, the liner includes a conventional thermal oxide liner formed by a thermal oxidation process. In some exemplary embodiments, the liner includes a semiconductor nitride formed via HDP-CVD.

Forming the isolation feature may also include depositing a fill dielectric 502 within the trenches 402. Exemplary fill dielectric 502 materials include a semiconductor oxide, a semiconductor nitride, a semiconductor oxynitride, fluoride-doped silicate glass (FSG) and/or a low-K dielectric material. In various exemplary embodiments, an oxide fill dielectric 502 is formed using a HDP-CVD process, a sub-atmospheric CVD (SACVD) process, a high-aspect ratio process (HARP), and/or a spin-on process.

Forming the isolation feature may also include performing a chemical mechanical polish/planarization (CMP) process following the deposition of the fill dielectric 502. In some embodiments, a hard mask layer (e.g., mask layer 304) is used as a polish stop. Following the CMP process, the mask layer 304 and/or the pad layer 302 may be removed. In some embodiments, a thermal annealing process is performed on the substrate 102 after deposition of the fill dielectric 502.

Referring to block 208 of FIG. 2 and to FIGS. 6A and 6B, a portion of the fin structure 104 is recessed below the top surface of the isolation features 106. In some such embodiments, an anisotropic plasma etching process selectively removes the substrate material of the fin structure 104 using the isolation features 106 as a mask. Various suitable etching gasses include $Cl_2$, HBr, $NF_3$, $CF_4$, and $SF_6$. This etching forms a channel cavity and defines a lower region 602 of the fin structure 104.

Figure 7B:
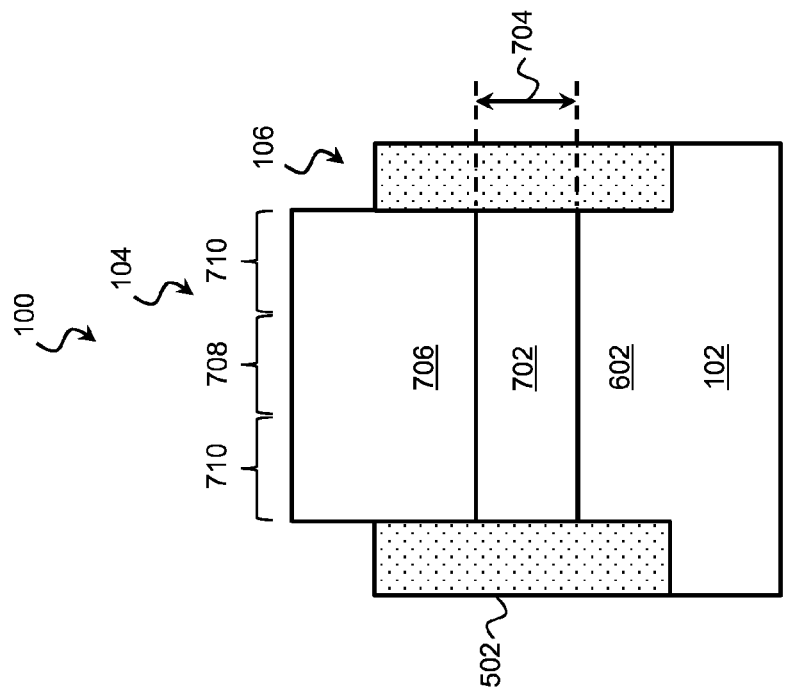
Figure 7A:
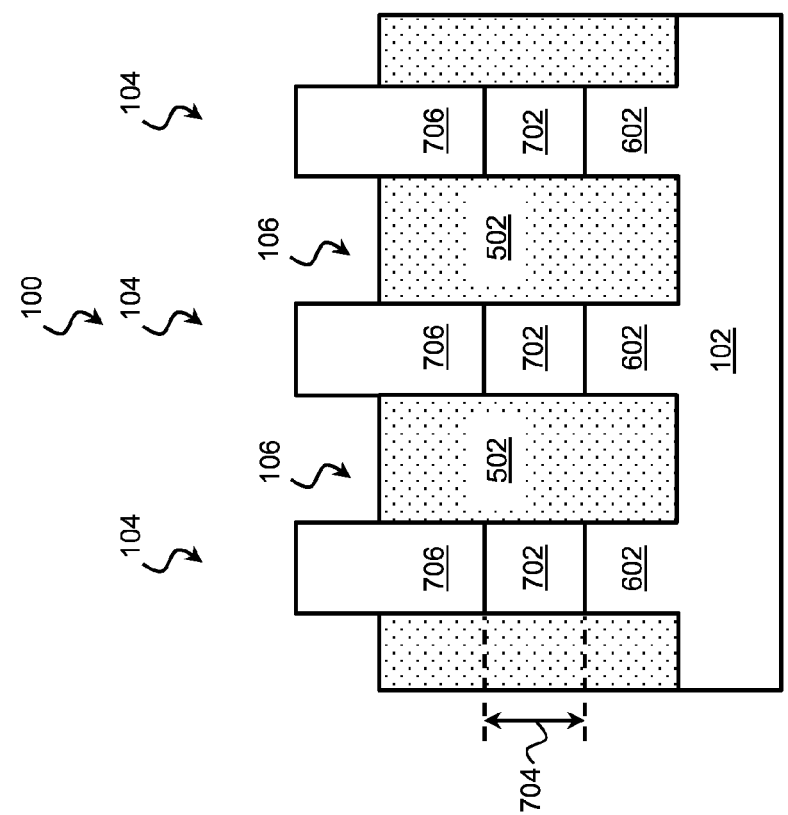

Referring to block 210 of FIG. 2 and to FIGS. 7A and 7B, a second semiconductor material 702 is deposited on the lower region 602. The second semiconductor material 702 may be different in material and/or structure from the semiconductor material of the substrate 102. For example, the substrate 102 may include an elementary semiconductor (e.g., crystalline silicon), while the second semiconductor material 702 may include a compound semiconductor (e.g., silicon germanium). As an oxide will be selectively formed on the second semiconductor material 702, in many embodiments, the second semiconductor material 702 is configured to have a different oxidation characteristic than the substrate 102. In some such embodiments, a second semiconductor material 702 comprising SiGe having at least about 20% (atomic percent) germanium is formed because it oxidizes at a lower temperature and shorter duration than a crystalline silicon substrate 102. It has also been determined that only particular configurations of semiconductor material oxidize in a manner that imparts the proper strain on the channel region of the fin structure 104. SiGe with a germanium concentration of greater than 45% (atomic percent) may develop an oxidation formation that electrically insulates but does not sufficiently strain a channel formed on the fin structure 104. Accordingly, in some embodiments, the second semiconductor material 702 is formed having a germanium concentration between about 20% (atomic percent) and about 45% (atomic percent). As another example, thinner semiconductor layers may still form sufficient oxide to electrically isolate a fin structure 104 from the body of the substrate 102, but they may not form enough oxide to impart the proper strain. Accordingly, in some embodiments, a second semiconductor material 702 comprising SiGe and having a thickness (measured perpendicular to the top surface of the substrate 102 as indicated by marker 704) of not less than about 30 nm produces both the proper electrical isolation and the proper strain.

The second semiconductor material 702 is deposited according to the principles of the present disclosure in order to provide both electrical isolation and channel strain once the semiconductor material 702 is oxidized. In one such embodiment, a silicon germanium second semiconductor material 702 with a germanium concentration between about 20% (atomic percent) and about 45% (atomic percent) is grown to a thickness of not less than about 30 nm on a crystalline silicon substrate 102 by an LPCVD process performed at a temperature between about 400° C. and about 800° C. and a pressure of between about 1 Torr and about 200 Torr. Suitable LPCVD gasses include $SiH_2Cl_2$, $SiH_4$, $GeH_4$, HCl, $B_2H_6$, and $H_2$.

Referring to block 212 of FIG. 2 and referring still to FIGS. 7A and 7B, an intermediate region of the fin structure 104 is formed by depositing a third semiconductor material 706 on the second semiconductor material 702. The third semiconductor material 706 may be different in material and/or structure from the second semiconductor material 702 and/or substrate 102. In some such embodiments, the third semiconductor material 706 is similar in material and structure to the substrate 102, while being different from the second semiconductor material 702. For example, in some such embodiments, the third semiconductor material 706 and the substrate 102 both include an elementary semiconductor (e.g., crystalline silicon), while the second semiconductor material 702 may include a compound semiconductor (e.g., silicon germanium). In one such embodiment, a crystalline silicon third semiconductor material 706 is grown on a silicon germanium second semiconductor material 702 by an LPCVD process performed at a temperature between about 400° C. and about 800° C. and a pressure of between about 1 Torr and about 200 Torr. Suitable LPCVD gasses include $SiH_4$ and $H_2$.

Referring to FIG. 7B, the fin structure 104 has a recognizable channel region 708 and source/drain regions 710. Subsequently, a gate structure may be formed over and surrounding the channel region 708, while the source/drain regions 710 may undergo an epitaxial process and/or implantation to grow source/drain structures. A selective oxidation of the second semiconductor material 702 may be performed either before or after the formation of the source/drain structures.

Referring to block 214 of FIG. 2 and referring to FIGS. 8A and 8B, in an example of forming source/drain structures before performing the oxidation process, a dummy gate 802 is formed over the channel region 708 of the fin structure 104. Forming the dummy gate 802 may include depositing a layer containing polysilicon or other suitable material and patterning the layer in a lithographic process. In some embodiments, gate spacers 804 or sidewall spacers are formed on each side of the dummy gate 802 (on the sidewalls of the dummy gate 802). The gate spacers 804 may be used to offset subsequently formed source/drain structures and may be used for designing or modifying the source/drain structure (junction) profile. The gate spacers 804 may comprise any suitable dielectric material, such as a semiconductor oxide, a semiconductor nitride, a semiconductor carbide, a semiconductor oxynitride, other suitable materials, and/or combinations thereof.

Figure 9B:
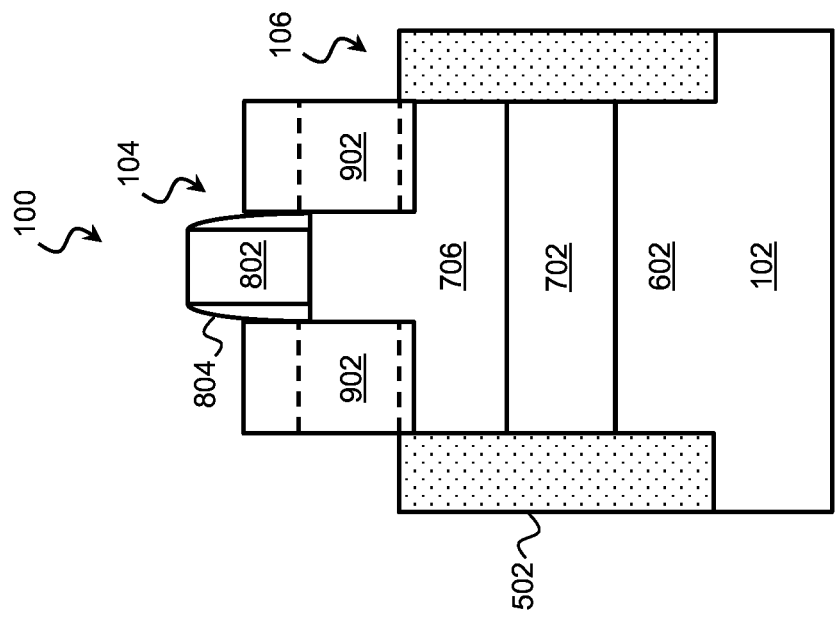
Figure 9A:
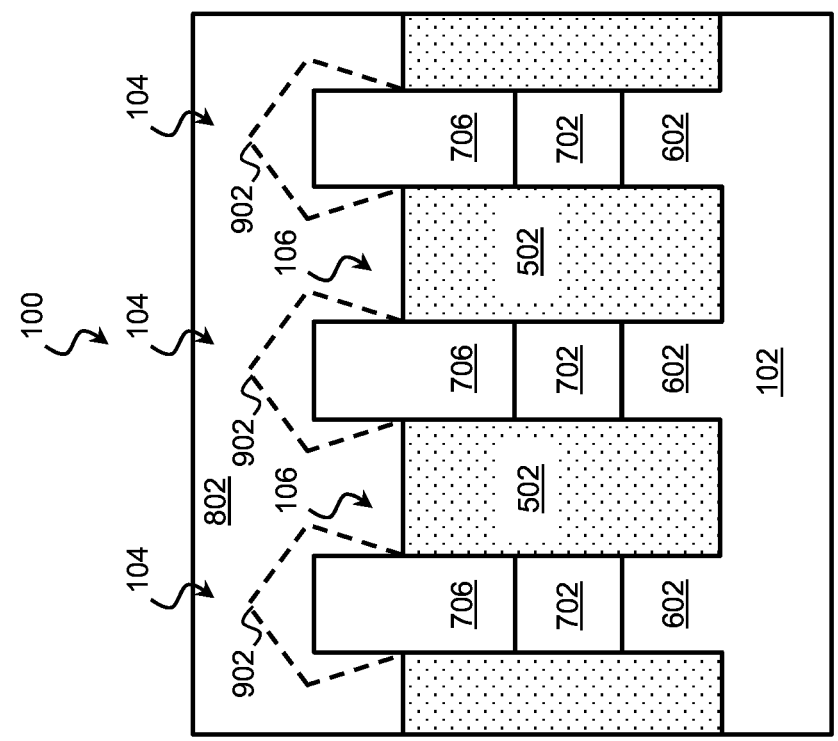

Referring to block 216 of FIG. 2 and to FIGS. 9A and 9B, raised source/drain structures 902 are formed on the third semiconductor material 706 of the fin structure 104. Referring to FIG. 9A, the raised source/drain structures 902 are indicated by a dashed boundary as they are beyond the cross-sectional plane. The dummy gate 802 and/or gate spacers 804 limit the source/drain structures 902 to the source/drain regions 710 of the fin structure 104 as shown in FIG. 9B. In many embodiments, the source/drain structures 902 are formed by one or more epitaxy or epitaxial (epi) processes, whereby Si features, SiGe features, and/or other suitable features are grown in a crystalline state on the fin structure 104. Suitable epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the fin structure 104.

The source/drain structures 902 may be in-situ doped during the epitaxy process by introducing doping species including: p-type dopants, such as boron or $BF_2$; n-type dopants, such as phosphorus or arsenic; and/or other suitable dopants including combinations thereof. If the source/drain structures 902 are not in-situ doped, an implantation process (i.e., a junction implant process) is performed to dope the source/drain structures 902. One or more annealing processes may be performed to activate the source/drain structures 902. Suitable annealing processes include rapid thermal annealing (RTA) and/or laser annealing processes.

Referring to block 218 of FIG. 2 and to FIGS. 10A and 10B, a protective dielectric layer 1002 is formed around the dummy gate 802 and/or gate spacers 804. The protective dielectric layer 1002 may comprise any suitable dielectric material, such as a semiconductor oxide, a semiconductor nitride, a semiconductor carbide, a semiconductor oxynitride, other suitable materials, and/or combinations thereof. In many embodiments, the protective dielectric layer 1002 comprises a different dielectric material than the dummy gate 802 so that the dummy gate 802 structure can be selectively removed. Accordingly, after depositing the protective dielectric, the dummy gate 802 may then be removed.

Figure 11B:
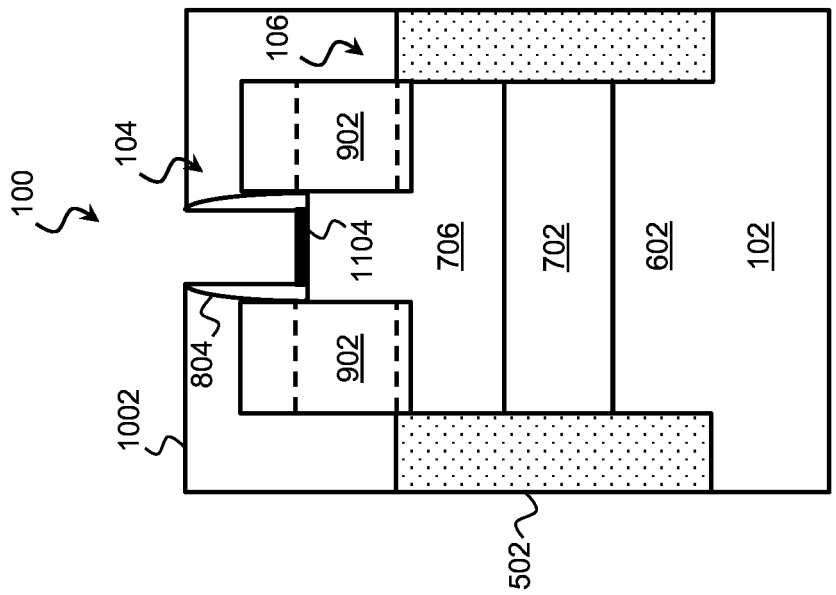
Figure 11A:
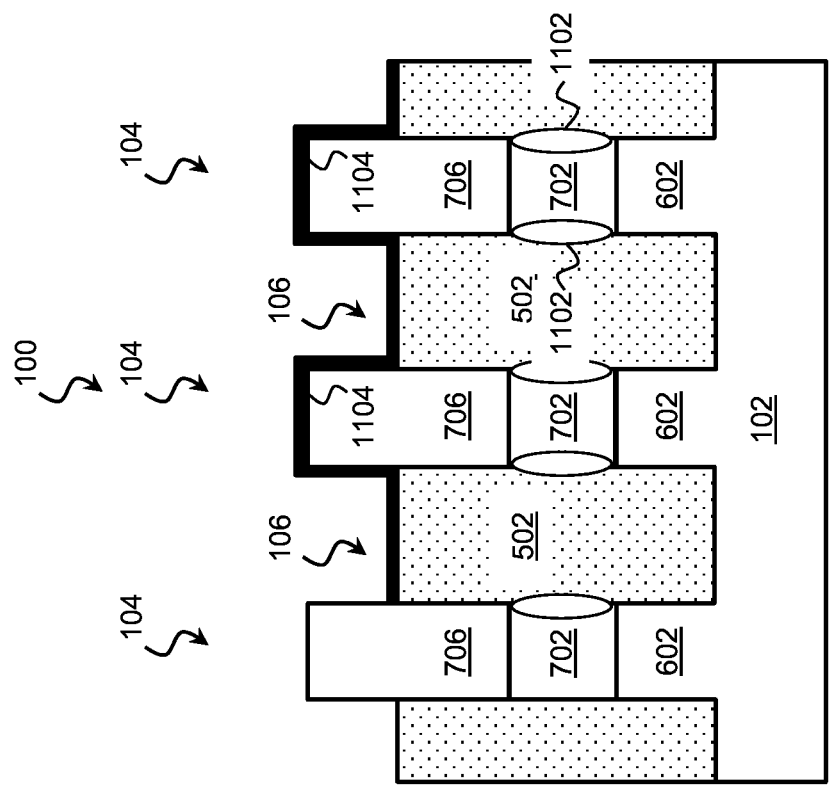

Referring to block 220 of FIG. 2 and to FIGS. 11A and 11B, a penetrating oxidation process is performed in order to selectively oxidize the second semiconductor material 702 without oxidizing the substrate 102 or other surrounding structures. The penetrating oxidation causes a semiconductor oxide 1102 to form on the portion of the second semiconductor material 702 adjacent to the fill dielectric 502. As discussed above, the penetrating oxidation may be performed on a subset of fin structures selected based on device type, device properties, application, and/or other suitable criteria.

In an exemplary embodiment, the penetrating oxidation process includes forming a sacrificial oxide layer 1104 within the void left by removing the dummy gate 802. The sacrificial oxide layer 1104 may include a thin film of a semiconductor oxide and may be formed formed using an LPCVD or PECVD process.

In some exemplary embodiments, the oxidation is performed at a temperature of between about 500° C. and about 600° C., at a pressure between about 1 atm and about 20 atm, and using $H_2O$ as a reaction gas. By adjusting the temperature, duration, and other parameters of the oxidation, a number of different oxide 1102 profiles can be formed on the second semiconductor material 702 including those illustrated in FIGS. 12A-12D.

The semiconductor oxide 1102 electrically isolates the channel region 708 of the fin structure 104 from the remainder of the substrate 102. This reduces leakage between fin structures 104 and between a fin structure 104 and the substrate 102. Additionally, it has also been found that certain formations of the semiconductor oxide 1102 cause a strain on both the second semiconductor material 702 and the third semiconductor material 706. When formed under the proper conditions, this semiconductor oxide 1102 can be used to improve carrier mobility throughout the associated device. Unexpectedly, this strain actually improves carrier mobility of nMOS devices more than pMOS devices.

Referring to block 222 of FIG. 2 and to FIGS. 13A and 13B, a gate 1302 is formed over the substrate 102 and wrapping around the channel regions of one or more fin structures 104. Although it is understood that gate 1302 may be any suitable gate, in some embodiments, gate 1302 is a high-k metal gate and includes an interfacial layer, a dielectric layer, and a metal gate layer that may, in itself comprise a number of layers.

In one such embodiment, an interfacial layer including an oxide, HfSiO, and/or an oxynitride is deposited by a suitable method, such as atomic layer deposition (ALD), chemical vapor deposition CVD and/or ozone oxidation. In the embodiment, a high-k dielectric layer is deposited on the interfacial layer by a suitable technique, such as ALD, CVD, metal-organic CVD (MOCVD), physical vapor deposition (PVD), thermal oxidation, combinations thereof, and/or other suitable techniques. The high-k dielectric layer may include LaO, AlO, ZrO, TiO, Ta2O5, Y2O3, SrTiO3 (STO), BaTiO3 (BTO), BaZrO, HfZrO, HfLaO, HfSiO, LaSiO, AlSiO, HfTaO, HfSiO, (Ba,Sr)TiO3 (BST), Al2O3, Si3N4, oxynitrides (SiON), or other suitable materials.

A metal gate layer may be formed by ALD, PVD, CVD, or other suitable process, and may include a single layer or multiple layers, such as a metal layer, a liner layer, a wetting layer, and/or an adhesion layer. The metal gate layer may include Ti, Ag, Al, TiAlN, TaC, TaCN, TaSiN, Mn, Zr, TiN, TaN, Ru, Mo, Al, WN, Cu, W, or any suitable materials. In some embodiments, different metal gate materials are used for nMOS and pMOS devices. A CMP process may be performed to a substantially planar top surface of the gate 1302.

The substrate 102 may undergo further CMOS or MOS technology processing to form various features and regions known in the art. For example, subsequent processing may form various conductive structures including contacts, vias, and, lines on the substrate 102, configured to electrically couple the various features formed on the substrate.

Figure 14:
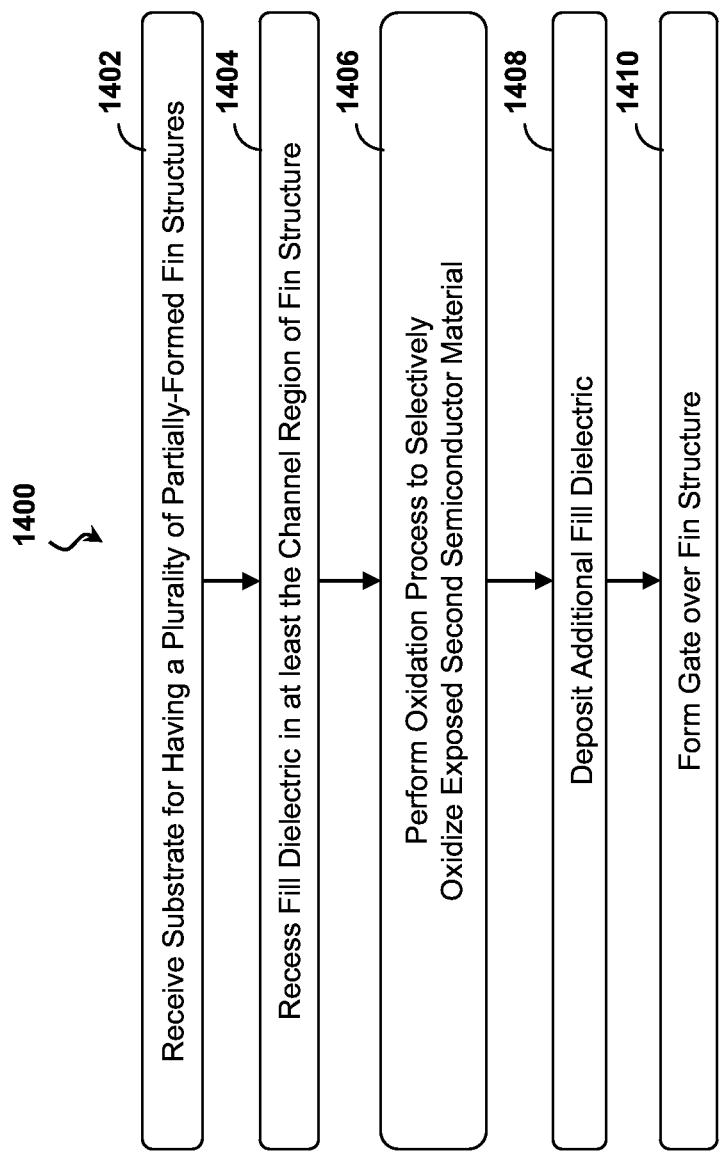
FIG. 14 is a flow diagram of a method for forming a workpiece having a fin structure with a buried insulator layer according to various aspects of the present disclosure.

As described above, the principles of the present disclosure can be adapted to any suitable method for forming a fin structure 104. A further such method is described with reference to FIGS. 15A-19A. The method exposes the second semiconductor material 702 prior to oxide formation rather than performing a penetrating oxidation. FIG. 14 is a flow diagram of a method 1400 for forming a workpiece 100 having a fin structure 104 with a buried insulator layer according to various aspects of the present disclosure. It is understood that additional steps can be provided before, during, and after the method 1400 and that some of the steps described can be replaced or eliminated for other embodiments of the method. FIGS. 15A-19A are cross-sectional views of a portion of the workpiece 100 undergoing the method 200 for forming a fin structure 104 with a buried insulator layer according to various aspects of the present disclosure. FIGS. 15A, 16A, 17A, 18A, and 19A are cross-sections taken along a first cross-sectional plane 108. FIGS. 15B, 16B, 17B, 18B, and 19B are cross-sectionals taken along a second cross-sectional plane 110. FIGS. 15A-19B have been simplified for the sake of clarity and to better illustrate the concepts of the present disclosure.

Figure 15B:
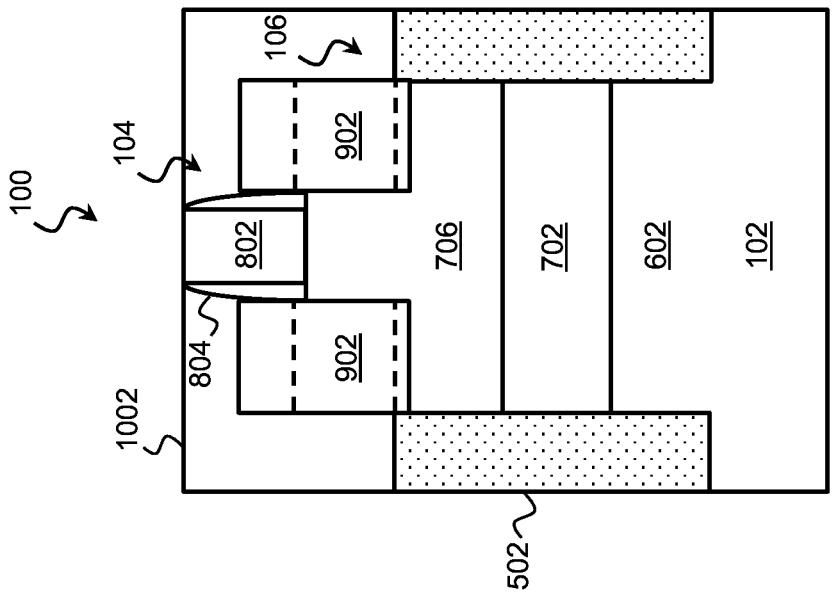
Figure 15A:
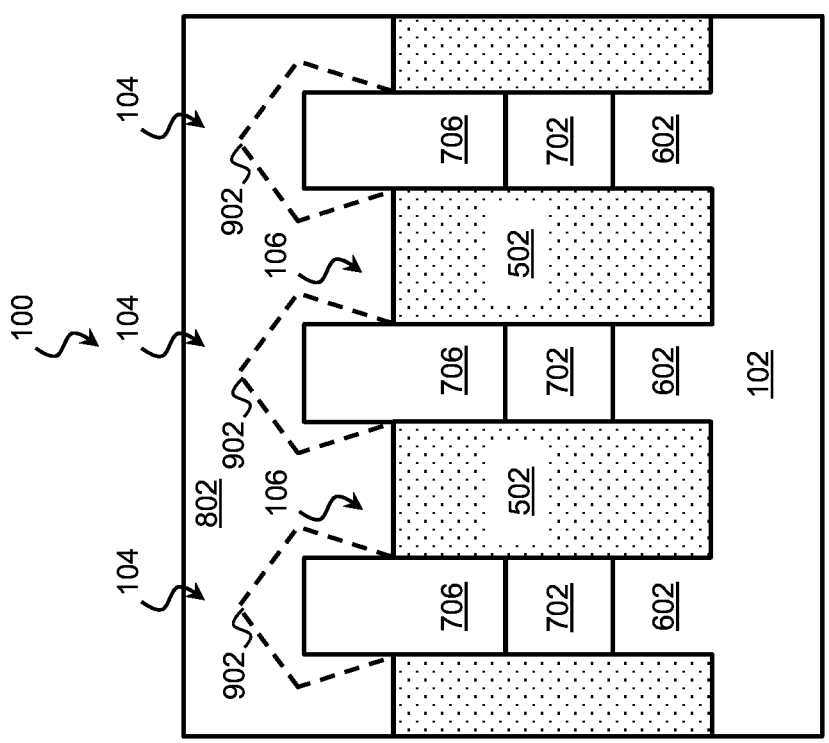
Figure 16B:
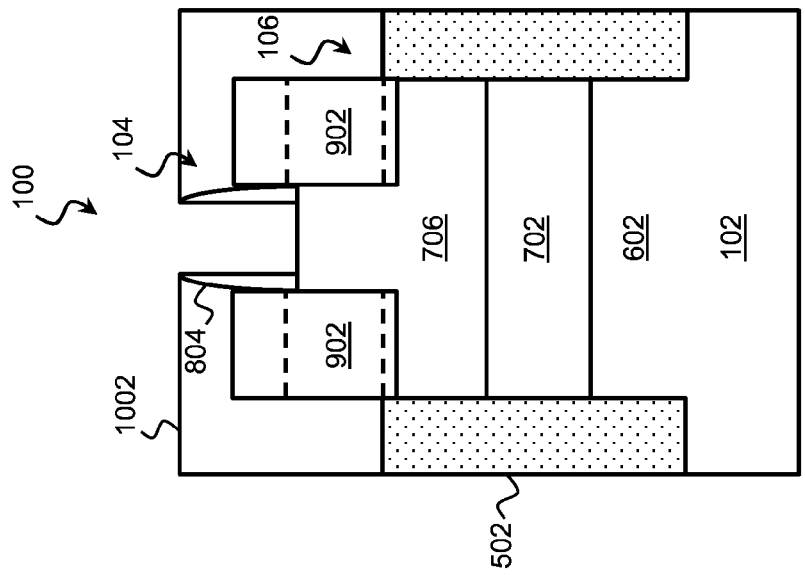
Figure 16A:
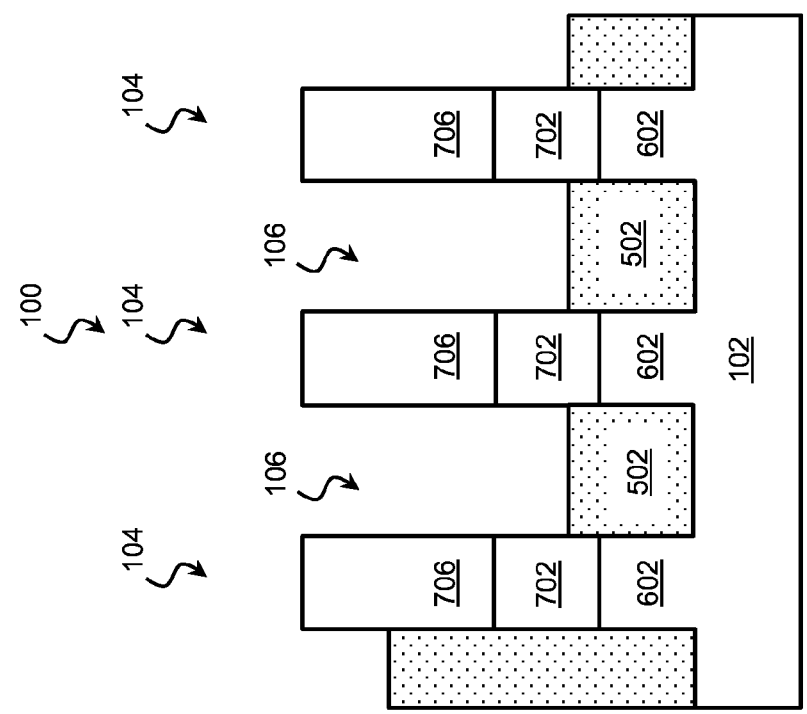

Referring first to block 1402 of FIG. 14 and to FIGS. 15A and 15B, a substrate 102 having a plurality of partially-formed fin structures 104 formed upon it is received. At this stage, the fin structures 104 may comprise a lower region 602, a second semiconductor material 702, a third semiconductor material 706, and raised source/drain structures 902, each substantially similar to those described with reference to FIGS. 3A-10B. Each fin structure 104 may include a protective dielectric layer 1002, a dummy gate 802 and/or gate spacers 804 formed upon the fin structure 104, and each fin structure 104 may be separated by an isolation feature 106 including a fill dielectric 502, each substantially similar to those described with reference to FIGS. 3A-10B. In that regard, the substrate 102 and associated features may be formed substantially as described with reference to blocks 202-218 of FIG. 2 and to FIGS. 3A-10B.

Instead of performing a penetrating oxidation, the fill dielectric 502 may be etched back to expose the portion of the second semiconductor material 702 to be oxidized. As discussed above, the penetrating oxidation may be performed on a subset of fin structures selected based on device type, device properties, application, and/or other suitable criteria. Referring to block 1404 of FIG. 14 and to FIGS. 16A and 16B, the fill dielectric 502 is recessed below the top surface of the second semiconductor material 702. The recessing process may include dry etching process, wet etching process, and/or combination thereof.

In some embodiments, only the portion of the fill dielectric 502 adjacent to the channel region is recessed. To do so, the recessing of the fill dielectric 502 is performed after removing the dummy gate 802. The protective dielectric layer 1002 limits the etching to the cavity left after removing the dummy gate 802. In alternate embodiments, the fill dielectric 502 along the entire length of the fin structure 104 is recessed.

Referring to block 1406 of FIG. 14 and to FIGS. 17A and 17B, an oxidation process is performed in order to selectively oxidize at least the exposed portion of the second semiconductor material 702. The oxidation causes a semiconductor oxide 1102 to form on the second semiconductor material 702. The semiconductor oxide 1102 electrically isolates the channel region 708 of the fin structure 104 from the remainder of the substrate 102 and provides a strain on the channel region that improves carrier mobility throughout the associated device. The oxidation process may be performed substantially as described in block 220 of FIG. 2. That is, in some exemplary embodiments, the oxidation is performed at a temperature of between about 500° C. and about 600° C., at a pressure between about 1 atm and about 20 atm, and using $H_2O$ as a reaction gas. As an additional suitable technique, because the material to be oxidized is exposed, a conventional thermal oxidation may be performed using ambient oxygen or other reaction gas. By adjusting the temperature, duration, and other parameters of the oxidation, a number of different oxide 1102 profiles can be formed on the second semiconductor material 702 including those illustrated in FIGS. 12A-12D.

Figure 18B:
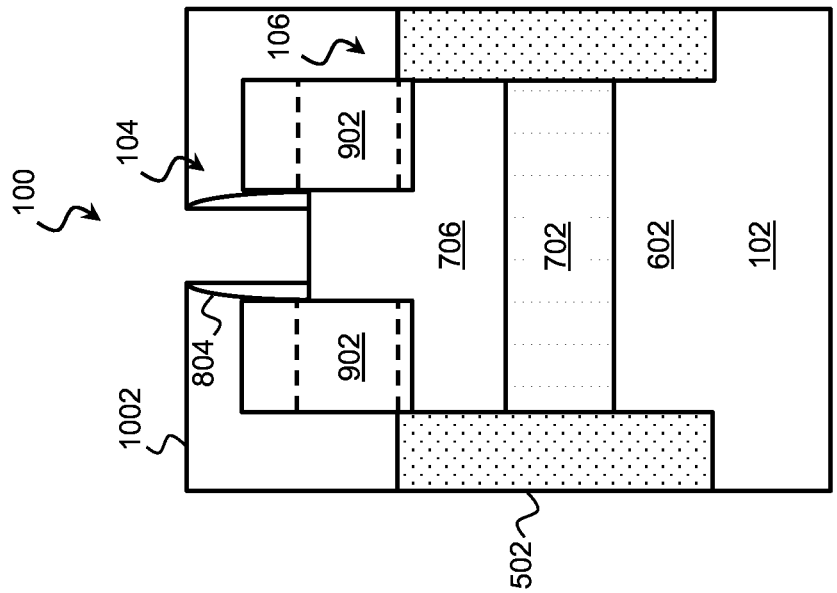
Figure 18A:
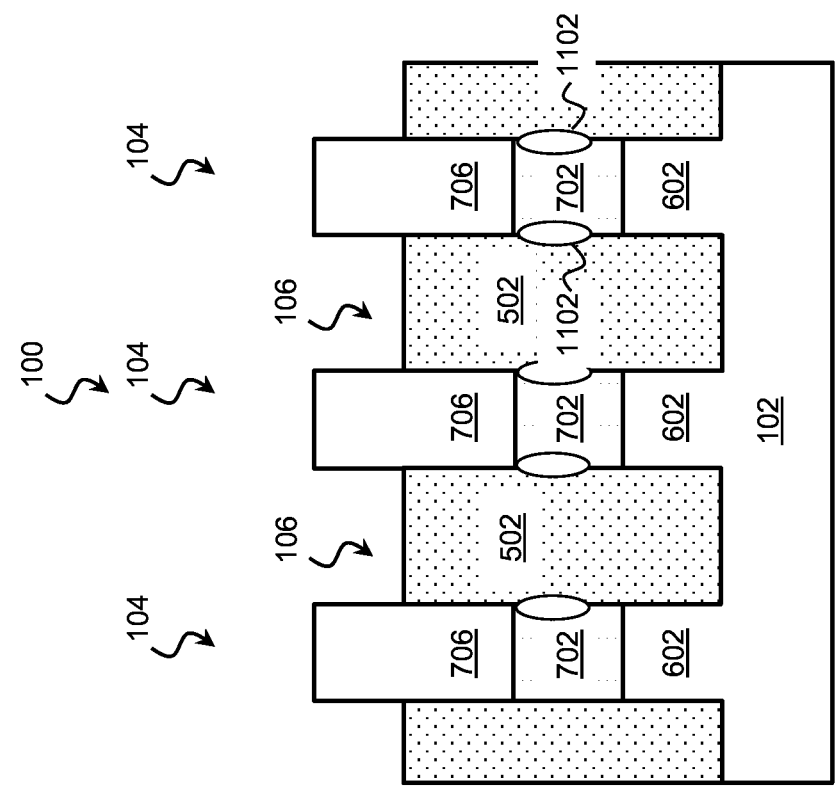

Referring to block 1408 of FIG. 14 and to FIGS. 18A and 18B a portion of the removed fill dielectric may be restored. This may include depositing a semiconductor oxide, a semiconductor nitride, a semiconductor oxynitride, fluoride-doped silicate glass (FSG) and/or a low-K dielectric material within the isolation feature 106. The fill dielectric deposited in block 1408 may the same or different from fill dielectric deposited block 206 and/or recessed in block 1404. In various exemplary embodiments, the fill dielectric 502 is formed using a HDP-CVD process, a sub-atmospheric CVD (SACVD) process, and/or a high-aspect ratio process (HARP).

Referring to block 1410 of FIG. 2 and to FIGS. 19A and 19B, a gate 1302 is formed over the substrate 102 and wrapping around the channel regions of one or more fin structures 104. The process may be substantially similar to that of block 222 of FIG. 2. Although it is understood that gate 1302 may be any suitable gate, in some embodiments, gate 1302 is a high-k metal gate and includes an interfacial layer, a dielectric layer, and a metal gate layer.

The substrate 102 may undergo further CMOS or MOS technology processing to form various features and regions known in the art. For example, subsequent processing may form various conductive structures including contacts, vias, and, lines on the substrate 102, configured to electrically couple the various features formed on the substrate.

Method 200 of FIG. 2 and method 1400 of FIG. 14 are only a few examples of methods for forming a fin structure 104 that may be adapted to form a buried insulator layer according to the principles of the present disclosure. Other suitable methods are disclosed in U.S. application Ser. No. 13/740,373, filed Jan. 14, 2013, entitled "Semiconductor Device and Fabricating the Same," U.S. application Ser. No. 13/902,322, filed May 24, 2013, entitled "FinFET Device and Method of Fabricating Same," and U.S. application Ser. No. 13/934,992, filed Jul. 3, 2013, entitled "Fin Structure of Semiconductor Device" each of which is herein incorporated in its entirety.

Thus, the present disclosure provides a workpiece with a fin structure having a buried insulator layer and a method for forming workpiece. In some embodiments, a semiconductor device is provided. The semiconductor device comprises: a substrate including a first semiconductor material and having a fin structure disposed thereupon, wherein the fin structure includes: a lower region proximate to the substrate;

a second semiconductor material disposed on the lower region; a third semiconductor material disposed on the second semiconductor material; and an insulating material selectively disposed on the second semiconductor material such that the insulating material electrically isolates a channel region of the fin structure and further such that the insulating material exerts a strain on the channel region; and an isolation feature disposed adjacent to the fin structure.

In further embodiments, a method of manufacturing a semiconductor device is provided. The method comprises: receiving a substrate including a first semiconductor and having a fin structure disposed on the substrate, wherein the fin structure comprises: a lower region, a second semiconductor formed on the lower region; and a third semiconductor formed on the second semiconductor; performing a selective oxidation in order to selectively form a semiconductor oxide on a portion of the second semiconductor underlying a channel region of the fin structure, wherein the performing of the selective oxidation forms the semiconductor oxide to exert a strain on the channel region; and forming a semiconductor device on the fin structure.

In yet further embodiments, a method of manufacturing a semiconductor device is provided. The method comprises: receiving a substrate including a first semiconductor material; etching the substrate to define a lower region of a fin structure; forming an isolation feature adjacent to the fin structure; depositing a second semiconductor material on the lower region of the fin structure; depositing a third semiconductor material on the second semiconductor material; selectively oxidizing the second semiconductor material to form a semiconductor oxide such that the semiconductor oxide electrically insulates a channel region of the fin structure and further such that the semiconductor oxide exerts a strain on the channel region; and forming an active device on the fin structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
    a fin structure disposed over a substrate, wherein the fin structure includes:
        a first semiconductor material portion,
        a second semiconductor material portion disposed on the first semiconductor material portion, and
        a third semiconductor material portion disposed on the second semiconductor material portion;
    an isolation feature disposed adjacent to the fin structure, such that the isolation feature is disposed along sidewalls of the first semiconductor material portion and the second semiconductor material portion; and
    an insulating material selectively disposed on the second semiconductor material portion, such that the insulating material is disposed between the isolation feature and sidewalls of the second semiconductor material portion, wherein the insulating material is further disposed on a portion of a sidewall of at least one of the first semiconductor material and the third semiconductor material, and further wherein the insulating material electrically isolates a channel region of the fin structure, and the insulating material exerts a strain on the channel region.

2. The semiconductor device of claim 1, wherein each of the first semiconductor material portion and the third semiconductor material portion includes crystalline Si, and wherein the second semiconductor material portion includes SiGe.

3. The semiconductor device of claim 1, wherein a thickness of the second semiconductor material portion is greater than or equal to about 30 nm.

4. The semiconductor device of claim 1, wherein the second semiconductor material portion includes an atomic percentage of Ge between about 20% and about 45%.

5. The semiconductor device of claim 4, wherein a thickness of the second semiconductor material portion is greater than or equal to about 30 nm.

6. The semiconductor device of claim 1, wherein the insulating material includes a semiconductor oxide.

7. The semiconductor device of claim 6, wherein the insulating material includes silicon oxide.

8. The semiconductor device of claim 1, wherein the isolation feature is disposed along a portion of sidewalls of the third semiconductor material portion.

9. The semiconductor device of claim 1, wherein the strain exerted by the insulating material imparts a tensile strain when the semiconductor device is an nMOS device.

10. A device comprising:
    a substrate;
    a fin structure extending from the substrate, wherein the fin structure includes:
        a first semiconductor material disposed on the substrate,
        a second semiconductor material disposed on the first semiconductor material, wherein the second semiconductor material has a different composition than the first semiconductor material,
        a semiconductor oxide material disposed on at least one side surface of the second semiconductor material, wherein the semiconductor oxide material is separated from the first semiconductor material by the second semiconductor material, and
        a third semiconductor material disposed on the second semiconductor material, wherein the third semiconductor material has a different composition than the second semiconductor material, and further wherein the semiconductor oxide material physically contacts the third semiconductor material; and
    an isolation feature disposed adjacent to the fin structure, such that the first semiconductor material, the second semiconductor material, and the semiconductor oxide material are buried in the isolation feature; and
    a gate disposed on a top surface and opposing side surfaces of the third semiconductor material.

11. The device of claim 10, wherein the semiconductor oxide material extends along the at least one side surface from the third semiconductor material toward the first semiconductor material.

12. The device of claim 10, wherein the semiconductor oxide material is further disposed along a bottom surface of the third semiconductor material.

13. The device of claim 10, wherein the second semiconductor material includes SiGe, and wherein the first semiconductor material and the third semiconductor material are each substantially free of Ge.

14. The device of claim 13, wherein the second semiconductor material includes an atomic percentage of Ge of between about 20% and about 45%.

15. A device comprising:
a substrate including a first semiconductor material;
a fin structure isolated from other fin structures by an isolation feature disposed in the substrate, wherein the fin structure includes:
a portion of the substrate including the first semiconductor material,
a second semiconductor material disposed on the first semiconductor material, the second semiconductor material having a different composition than the first semiconductor material,
an insulator layer disposed on the second semiconductor material, wherein the insulator layer is buried in the isolation feature,
a third semiconductor material disposed on the second semiconductor material, the third semiconductor material having a different composition than the second semiconductor material, and
wherein the insulator layer is further disposed on a side surface of at least one of: the first semiconductor material and the third semiconductor material; and
a gate disposed on the third semiconductor material and wrapping a channel region of the fin structure.

16. The device of claim 15, wherein the insulator layer is further configured to electrically isolate the channel region from the substrate.

17. The device of claim 15, wherein the insulator layer extends along opposing side surfaces of the second semiconductor material.

18. The device of claim 15, wherein the second semiconductor material includes SiGe, and wherein the first semiconductor material and the third semiconductor material are each substantially free of Ge.

* * * * *